(12) United States Patent
Kehler et al.

(10) Patent No.: US 6,825,736 B1
(45) Date of Patent: Nov. 30, 2004

(54) METHOD AND APPARATUS FOR CONTROLLING A VOLTAGE CONTROLLED OSCILLATOR

(75) Inventors: Walt Kehler, Sunrise, FL (US); Nihal Godambe, Plantation, FL (US)

(73) Assignee: Freescale Semiconductor, Inc., Austin, TX (US)

(*) Notice: Subject to any disclaimer, the term of this patent is extended or adjusted under 35 U.S.C. 154(b) by 48 days.

(21) Appl. No.: 10/449,403

(22) Filed: May 30, 2003

(51) Int. Cl.[7] ............................................. H03B 5/26
(52) U.S. Cl. ......................... 331/183; 331/182; 331/109
(58) Field of Search ................................ 331/183, 182, 331/109, 173

(56) References Cited

U.S. PATENT DOCUMENTS

| | | | |
|---|---|---|---|
| 4,430,627 A | * | 2/1984 | Machida ..................... 331/109 |
| 6,052,036 A | * | 4/2000 | Enstrom et al. ............. 331/176 |
| 6,064,277 A | * | 5/2000 | Gilbert .................... 331/117 R |
| 6,307,439 B2 | | 10/2001 | Cunning ....................... 331/10 |
| 2003/0025566 A1 | * | 2/2003 | Rogers ....................... 331/109 |

* cited by examiner

Primary Examiner—Robert Pascal
Assistant Examiner—Joseph Chang
(74) Attorney, Agent, or Firm—Posz & Bethards, PLC; Charles W. Bethards

(57) ABSTRACT

A level detector (110, 104) and corresponding method detects (602) whether an output signal level of a VCO (102) is within a window bounded by minimum and maximum thresholds. When the output signal level is not within the window, a loop-control element (108) closes (604) an AGC loop of the VCO and controls the gain of the VCO with a gain-control signal that tracks an AGC bias signal. When the output signal level is within the window, the loop-control element opens (606) the AGC loop and controls the gain with a fixed bias signal derived from the AGC bias signal at the time the AGC loop is opened.

21 Claims, 4 Drawing Sheets

METHOD AND APPARATUS FOR CONTROLLING A VOLTAGE CONTROLLED OSCILLATOR

CROSS REFERENCE TO RELATED APPLICATION

U.S. patent application Ser. No. 10-420,664 filed Apr. 22, 2003 by Godambe et al. and assigned to the assignee hereof is related to the instant application, and the reader is referred to the related application for further background.

FIELD OF THE INVENTION

This invention relates in general to voltage controlled oscillators, and more specifically to a method and apparatus for controlling a voltage controlled oscillator.

BACKGROUND OF THE INVENTION

It is desirable for a voltage controlled oscillator (VCO) used in a portable communication device to exhibit low phase noise in order to satisfy sideband noise requirements. Other applications may also require low phase noise. Prior-art VCOs have operated in open loop, and guaranteeing startup has implied using a high gain in the VCO amplifier. This high gain in the VCO amplifier in turn has produced a large output level. The large output level has resulted in increased phase noise and wasted power, which is unacceptable for portable communications equipment. Additionally, the higher gain needed to guarantee startup requires larger gain devices which increase the parasitic capacitive loading on the tank which in turn decreases frequency and decreases tuning bandwidth. To overcome these problems, some prior-art VCOs have used an automatic gain control (AGC) loop to control startup and the output level. Unfortunately, the AGC loop itself contributes additional phase noise and can cause amplitude instability.

BRIEF DESCRIPTION OF THE PREFERRED EMBODIMENTS

The accompanying figures, where like reference numerals refer to identical or functionally similar elements throughout the separate views and which together with the detailed description below are incorporated in and form part of the specification, serve to further illustrate various embodiments and to explain various principles and advantages all in accordance with the present invention.

DETAILED DESCRIPTION OF THE PREFERRED EMBODIMENTS

What is needed is a method and apparatus for controlling a VCO that decouples the relationship between startup and the ability to control the output level. The method and apparatus preferably will lend itself to fabrication as a low-power custom integrated circuit.

In overview, one embodiment according to the present invention concerns communications systems that utilize transceivers to provide service for communications units or more specifically a user thereof operating therein. More particularly, various inventive concepts and principles embodied as a method and apparatus for controlling a voltage controlled oscillator that may be used in equipment with such communications systems will be discussed and disclosed. Some examples of communications systems of particular interest are those being deployed and developed such as the Global System for Mobile Communications (GSM), Wideband Code Division Multiple Access, (W-CDMA), Third-Generation, (3G) systems, and evolutions thereof, although the concepts and principles have application in other systems and devices, as well.

The instant disclosure is provided to further explain in an enabling fashion the best modes of making and using various embodiments in accordance with the present invention. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued.

It is further understood that the use of relational terms, if any, such as first and second, top and bottom, and the like are used solely to distinguish one from another entity or action without necessarily requiring or implying any actual such relationship or order between such entities or actions.

Much of the inventive functionality and many of the inventive principles are best implemented with or in one or more conventional digital signal processors (DSPs), or with integrated circuits (ICs) such as custom or application-specific ICs. It is expected that one of ordinary skill, notwithstanding possibly significant effort and many design choices motivated by, for example, available time, current technology, and economic considerations, when guided by the concepts and principles disclosed herein will be readily capable of programming such DSPs, or generating such ICs with minimal experimentation. Therefore, in the interest of brevity and minimization of any risk of obscuring the principles and concepts according to the present invention, further discussion of such DSPs and ICs, if any, will be limited to the essentials with respect to the principles and concepts employed by the preferred embodiments.

Figure 1:
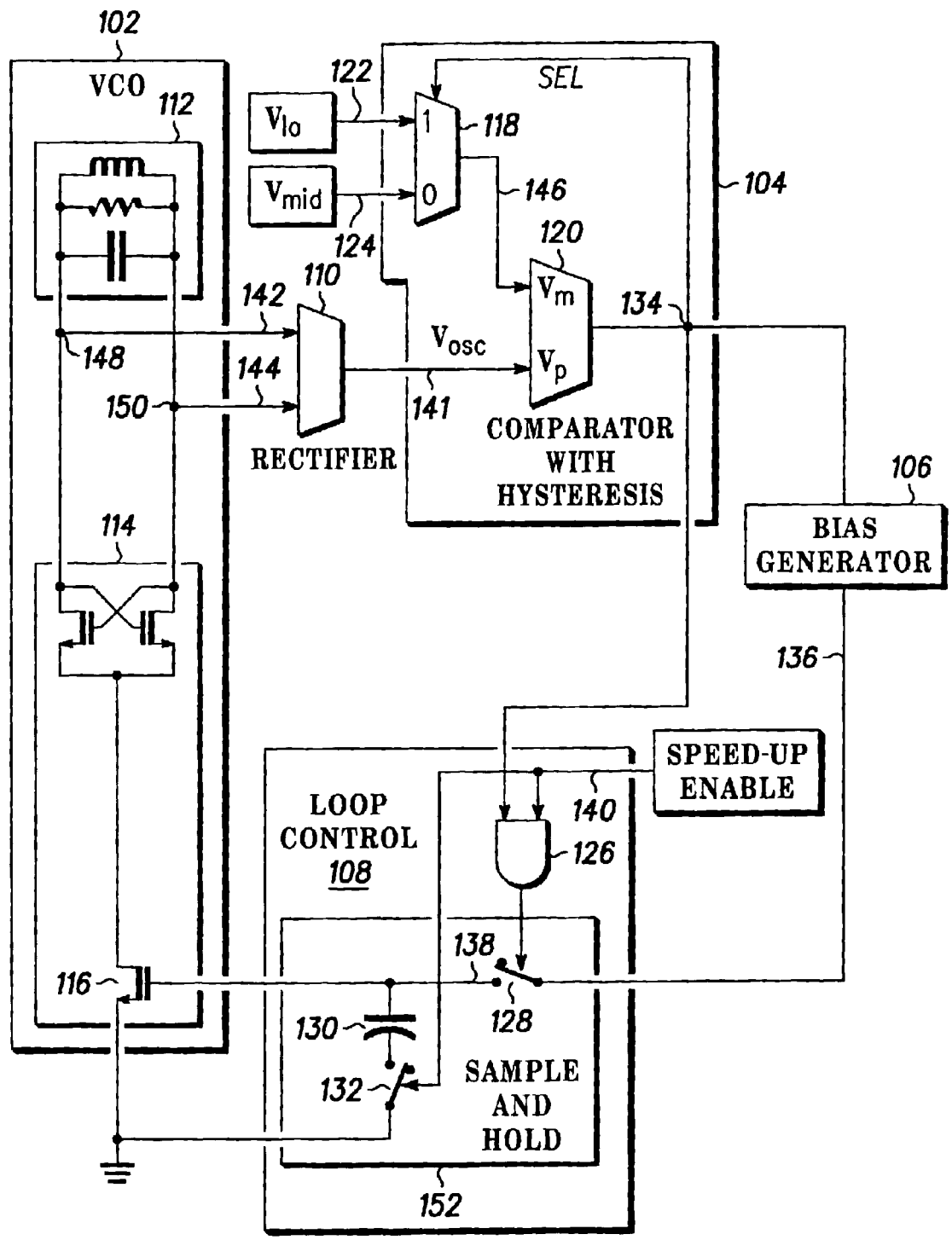
FIG. 1 is an electrical block diagram of an exemplary first embodiment of an amplitude-regulated voltage controlled oscillator (ARVCO).

Referring to FIG. 1, an electrical block diagram depicts an exemplary first embodiment 100 of an amplitude-regulated voltage controlled oscillator (ARVCO) comprising a voltage controlled oscillator (VCO) 102 including a conventional tank circuit 112 coupled to a conventional variable-gain negative transconductance cell 114 comprising a MOS transistor 116 for controlling the current through the cell 114 to adjust the gain of the cell 114 using well-known techniques. Output nodes 148, 150 of the VCO 102 are coupled to input nodes 142, 144 of a conventional rectifier 110 for generating a state signal, Vosc, at the rectifier output 141, indicating whether the VCO 102 is oscillating, and, when oscillating, further indicating the magnitude of the oscillation, i.e., the output signal level of the VCO 102. The rectifier output 141 is coupled to the positive input of a conventional comparator 120. The comparator output 134 is coupled to a conventional multiplexer 118 for selecting for the multiplexer output 146 a first multiplexer input 124 coupled to a first reference signal, Vmid, corresponding to a predetermined preferred operating value of the output signal level (e.g., for a low phase noise) of the VCO 102, when the comparator output 134 represents a binary zero. The multiplexer 118 further selects for the multiplexer output 146 a second multiplexer input 122 coupled to a second reference signal, Vlo, corresponding to a low threshold of the desired operating window for the output signal level of the VCO 102, when the comparator output 134 represents a binary one. The multiplexer output 146 is coupled to the negative input of the comparator 120. It will be appreciated that, in some embodiments, the first and second reference signals Vmid and Vlo can be electronically programmable.

In the first embodiment 100, the high threshold of the desired operating window preferably is the maximum output signal level that the VCO 102 can produce in the particular user application, e.g., at a higher level for a base station less concerned with current drain than phase noise and at a lower level for a handheld unit with opposite interests. The combination of, and coupling between, the comparator 120 and the multiplexer 118 produces a comparator with hysteresis 104, which effectively combines the first reference signal and the second reference signal into a single reference signal with hysteresis. Comparing the state signal, Vosc, with the single reference signal with hysteresis produces a hysteresis-derived comparison signal indicative of whether the output signal level of the VCO 120 is within the desired operating window. The combination of the rectifier 110 and the comparator with hysteresis 104 thus effectively forms a level detector for detecting whether the output signal level is within the desired window bounded by minimum and maximum thresholds.

The comparator output 134 is further coupled to a conventional bias generator 106 for generating an automatic gain control (AGC) bias signal on a bias generator output 136. The bias generator 106 preferably adds a simple voltage offset to the hysteresis-derived comparison signal at the comparator output 134 so that the resultant AGC bias signal is compatible with the variable-gain cell 114. The bias generator output 136 is coupled to a first electronic switch 128, e.g., a conventional transmission gate, coupled to a gain-control input 138, e.g., the gate, of the MOS transistor 116. A capacitor 130 is coupled through a speed-up electronic switch 132, e.g., a conventional transmission gate, to circuit ground. The speed-up electronic switch 132 is arranged to decouple the capacitor 130 from circuit ground to quicken the response of the AGC loop, in response to a logic signal applied to a speed-up control input 140 by an external processor (not shown). The capacitor 130 serves as a low-pass filter for a gain control signal generated by the AGC loop when both the switch 132 and the AGC loop are closed. In addition, the capacitor 130 serves as a holding capacitor of a sample-and-hold element 152 comprising the capacitor 130 and the first electronic switch 128. It will be appreciated that, alternatively, the sample and hold and speed-up functions may be separated and operated independently.

The first electronic switch 128 is coupled to a conventional two-input AND gate having first and second inputs coupled, respectively, to the speed-up control input 140 and to the comparator output 134 for controlling the sample-and-hold element 152. The AND gate 126 is arranged such that a binary zero from the AND gate 126 closes the AGC loop (by operating the sample-and-hold element 152 in a TRACK mode, e.g., with the first electronic switch 128 closed). The sample-and-hold element 152 is further arranged such that a binary one from the AND gate opens the AGC loop (by operating the sample-and-hold element 152 in a HOLD mode, e.g., with the first electronic switch 128 open). In this embodiment, the AND gate 126 and the sample-and-hold element 152 form a loop-control element 108, and the AGC loop comprises the rectifier 110, the comparator with hysteresis 104, the bias generator 106, and the loop-control element 108. The first embodiment 100 is a relatively simple embodiment that advantageously represents a low cost, low power version of an ARVCO. It will be appreciated that, when desired, some or all elements of the first embodiment can be implemented as a custom integrated circuit. It will be further appreciated that the sample and hold element need not be implemented by analog means as shown, but, alternatively, can be implemented in other manners, as for example, digitally by using memory elements along with analog-to-digital converter and digital-to-analog converter elements to accomplish the same sampling and holding functions.

Figure 2:
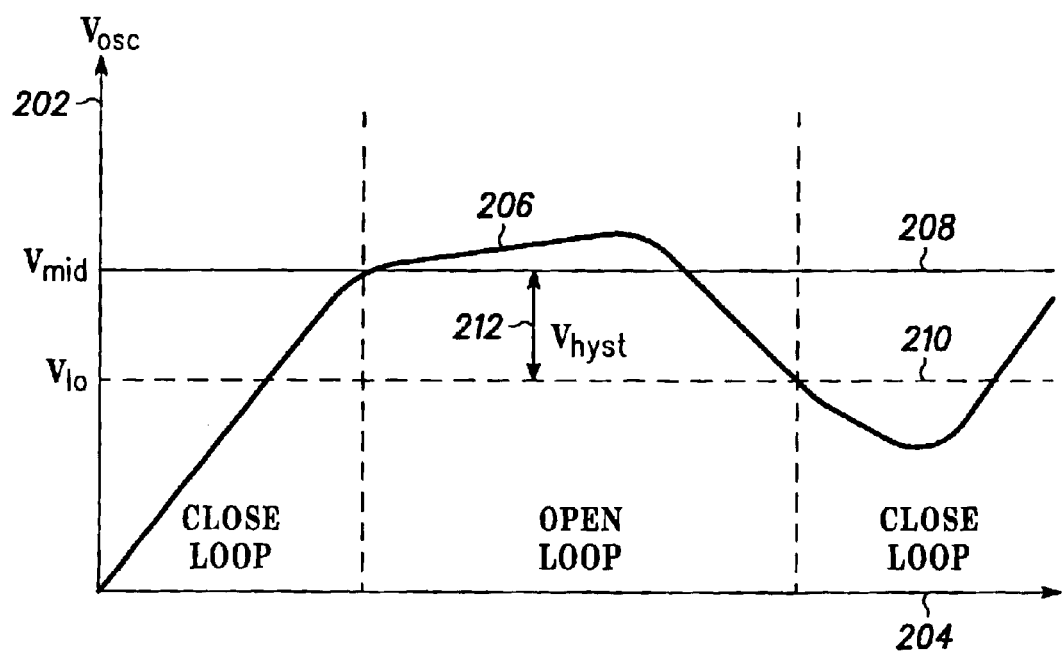
FIG. 2 is a graph depicting a transient response of the first embodiment.

FIG. 2 is a graph 200 depicting a transient response of the first embodiment. The state signal Vosc is represented on the vertical axis 202, while time is represented on the horizontal axis 204. The reference voltages Vlo 210 and Vmid 208 are also depicted. The curve 206 represents an exemplary transient response of the first embodiment 100 after startup. At startup, the state signal Vosc is small, and the comparator output 134 is a binary zero, causing the AND gate 126 and the sample-and-hold element 152 to close the AGC loop. The multiplexer 118 also thus selects Vmid as the comparison voltage for the comparator 120. When the speed-up enable signal is a binary zero (enabled), the capacitor 130 is decoupled, thereby speeding the response of the AGC loop and allowing Vosc to rise rapidly. Preferably, the speed-up enable is removed well before Vosc approaches Vmid, so that the capacitor 130 can charge to the appropriate AGC bias signal corresponding to the preferred VCO output signal level. When Vosc reaches Vmid, the signal at the comparator output 134 becomes a binary one, thereby opening the AGC loop and biasing the VCO's gain-control input 138 with a fixed bias voltage equal to the bias voltage held on the capacitor 130 at the time the loop was opened. The curve 206 demonstrates that Vosc then can move freely upward and downward as long as Vosc stays above Vlo. If Vosc falls below Vlo, however, then the AGC loop is again closed until Vosc climbs back up to Vmid. Thus the hysteresis 212 of the comparator with hysteresis 104 amounts to Vmid-Vlo.

Figure 3:
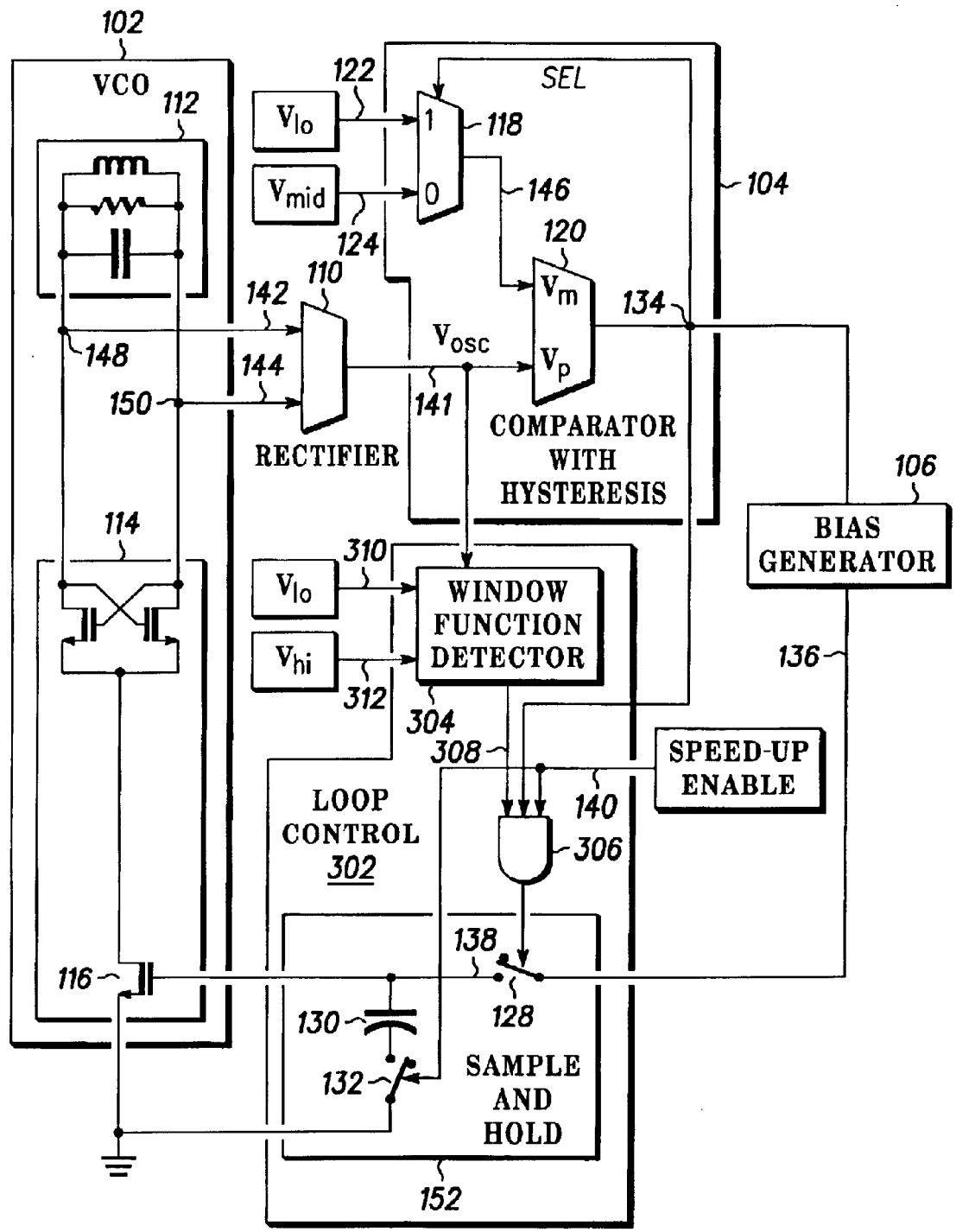
FIG. 3 is an electrical block diagram of an exemplary second embodiment of an amplitude-regulated voltage controlled oscillator.

Referring to FIG. 3, an electrical block diagram depicts an exemplary second embodiment 300 of an amplitude-regulated voltage controlled oscillator. The second embodiment 300 is similar to the first embodiment 100, the essential difference being that the loop-control element 108 has been replaced with a modified loop-control element 302. The modified loop-control element 302 comprises a window function detector 304 having first and second inputs 310, 312 coupled to third and fourth reference signals Vlo and Vhi, representing, respectively, minimum and maximum thresholds of a desired window for the output signal level of the VCO. The window function detector 304 is also coupled to the rectifier output 141 for comparing the state signal Vosc with Vlo and Vhi to determine whether the VCO output signal is within the desired window. The output 308 of the window function detector 304 is coupled to a third input of a three-input AND gate 306, whose first and second inputs are coupled, respectively, to the speed-up control input 140 and to the comparator output 134, as in the first embodiment 100. FIG. 3 depicts the same reference signal, Vlo, coupled to both the second multiplexer input 122 and the first input 310 of the window function detector 304. It will be appreciated that, in some embodiments, different reference signal values can be applied to the inputs 122 and 310. It will be further appreciated that any of the reference signals can utilize electronically programmable values. It also will be appreciated that, when desired, some or all elements of the second embodiment can be implemented as a custom integrated circuit.

Figure 4:
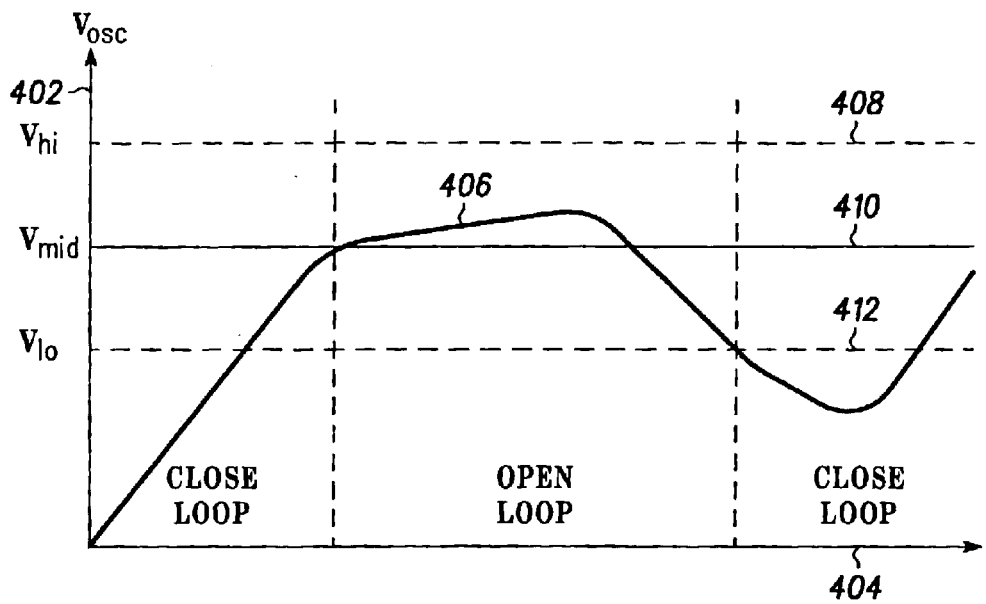
FIG. 4 is a graph depicting a transient response of the second embodiment.

FIG. 4 is a graph 400 depicting a transient response of the second embodiment 300. The state signal Vosc is represented on the vertical axis 402, while time is represented on the horizontal axis 404. The reference voltages Vlo 212, Vhi 408 and Vmid 410 are also depicted. The curve 406 represents an exemplary transient response of the second embodiment 300 after startup, which is similar to the curve 206 of the graph 200. While not depicted in the graph 400, in the second embodiment 300, should the state signal Vosc attempt to climb above the reference voltage Vhi, representing the maximum threshold, then the window function detector 304 would again close the AGC loop, thereby advantageously keeping the VCO output signal level within the desired window.

Figure 5:
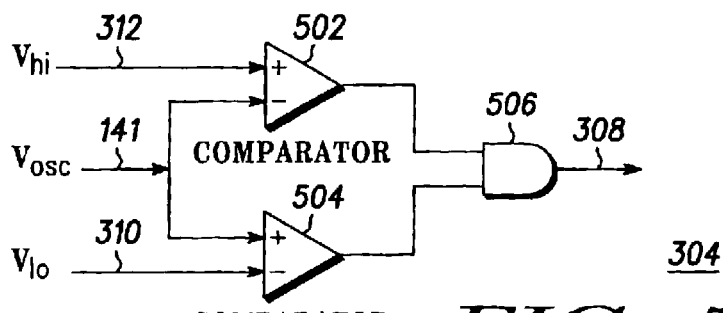
FIG. 5 is a schematic diagram of an exemplary window function detector.

Referring to FIG. 5, a schematic diagram depicts an exemplary window function detector 304 having the second input 312 coupled to the positive input of a conventional first comparator 502. The first input 310 is coupled to the negative input of a conventional second comparator 504. The rectifier output 141 providing the state signal, Vosc, is coupled to the negative input of the first comparator 502 and to the positive input of the second comparator 504. The outputs of the first and second comparators 502, 504 are coupled, respectively, to first and second inputs of a conventional AND gate 506. The output of the AND gate provides the output 308 of the window function detector 304.

In operation, the second comparator 504 compares the state signal Vosc with the reference signal Vlo representing the minimum threshold to produce a first comparison signal indicative of whether the output signal is above the minimum threshold. The first comparator 502 compares the state signal Vosc with the reference signal Vhi representing the maximum threshold to produce a second comparison signal indicative of whether the output signal is below the maximum threshold. The AND gate 506 combines the first and second comparison signals to produce at the output 308 a third comparison signal indicative of whether the output signal of the VCO is within the desired window.

The window function detector 304 advantageously provides the second embodiment 300 with an added degree of control that is missing in the first embodiment 100. It will be appreciated, however, that the added degree of control comes with a trade-off of added complexity and thus higher cost to manufacture and higher power consumption to use. This trade-off may make the first embodiment more desirable in applications in which a precise control of the maximum threshold for the output of the VCO is deemed unnecessary.

Figure 6:
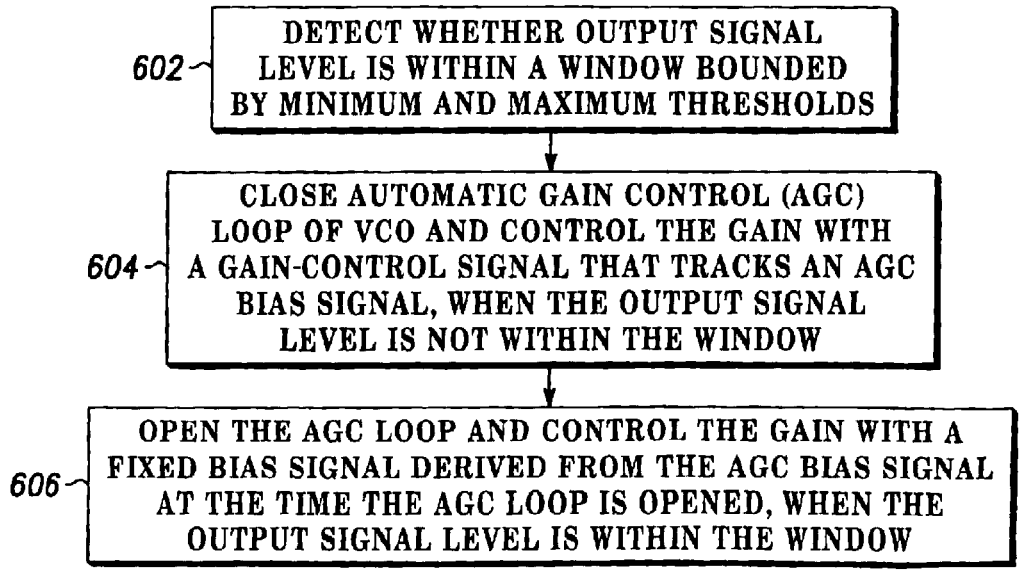
FIG. 6 is a flow diagram depicting operation of the first and second embodiments.

Referring to FIG. 6, a now diagram 600 depicting operation of the first and second embodiments begins with detecting 602 whether the output signal level of the VCO is within a window bounded by minimum and maximum thresholds. When the output signal level is not within the window, the first and second embodiments close 604 the AGC loop of the VCO and control the gain with a gain-control signal that tracks an AGC bias signal. When the output signal level is within the window, the first and second embodiments open 606 the AGC loop and control the gain with a fixed bias signal derived from the AGC bias signal at the time the AGC loop is opened.

Preferably, the opening of the AGC loop occurs when the output signal level is within the window and at a predetermined preferred value, selected, for example, for optimum phase noise. Also preferably, the opening and closing of the AGC loop is accomplished by coupling the sample-and-hold element 152 to the AGC bias signal on the bias generator output 136 and to the gain-control input node 138 of the VCO. Closing the AGC loop comprises operating the sample-and-hold element 152 in a TRACK mode, in which the gain-control signal on the gain-control input node 138 tracks the AGC bias signal. Opening the AGC loop comprises operating the sample-and-hold element 152 in a HOLD mode, in which the electronic switch 128 is opened, and the capacitor 130 holds the gain-control signal fixed at the value present at the time the AGC loop is opened. In addition, there is provided a feature for adjusting the response time of the AGC loop in response to a control signal (speed-up enable) coupled to the sample-and-hold element 152.

In the first embodiment, the maximum threshold is set substantially equal to a maximum output signal level that the VCO can produce in a particular user application. In this embodiment, detecting whether the output signal level is within the window comprises deriving, from the VCO operating condition, a state signal indicating whether the VCO is oscillating and, when oscillating, further indicating the magnitude of the oscillation; and comparing the state signal with a first reference signal representing the minimum threshold to produce a first comparison signal indicative of whether the output signal is above the minimum threshold and thus within the window.

In the second embodiment, detecting whether the output signal level is within the window comprises deriving a state signal from the VCO operating condition, and comparing the state signal with a first reference signal representing the minimum threshold to produce a first comparison signal indicative of whether the output signal is above the minimum threshold. Detecting whether the output signal level is within the window further comprises comparing the state signal with a second reference signal representing the maximum threshold to produce a second comparison signal indicative of whether the output signal is below the maximum threshold, and combining the first and second comparison signals to produce a third comparison signal indicative of whether the output signal is within the window.

In both the first and second embodiments, the comparator with hysteresis 104 combines a first reference signal and a second reference signal into a single reference signal with hysteresis; and compares the state signal with the single reference signal to produce a hysteresis-derived comparison signal indicative of whether the output signal is within the window.

Thus, it should be clear from the preceding disclosure that the present invention provides a method and apparatus for controlling a VCO that decouples the relationship between startup and output level. The method and apparatus advantageously lends itself to fabrication as a low-power custom integrated circuit which may be used in any desired application.

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiments were chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. A method for controlling a voltage controlled oscillator (VCO) having a gain and producing an output signal level, the method comprising:
    detecting whether the output signal level is within a window bounded by minimum and maximum thresholds;
    closing an automatic gain control (AGC) loop of the VCO and controlling the gain with a gain-control signal that tracks an AGC bias signal, when the output signal level is not within the window; and
    opening the AGC loop and controlling the gain with a fixed bias signal derived from the AGC bias signal at the time the AGC loop is opened, when the output signal level is within the window.

2. The method of claim 1, wherein opening the AGC loop occurs when the output signal level is within the window and at a predetermined preferred value.

3. The method of claim 1, further comprising:
    coupling a sample-and-hold element to the AGC bias signal and to a gain-control node of the VCO, and
        wherein closing the AGC loop comprises operating the sample-and-hold element in a TRACK mode, and
        wherein opening the AGC loop comprises operating the sample-and-hold element in a HOLD mode.

4. The method of claim 1, further comprising:
    adjusting a response time of the AGC loop in response to a control signal coupled to a sample-and-hold element.

5. The method of claim 1,
    wherein the maximum threshold is set substantially equal to a maximum output signal level that the VCO can produce in a particular user application, and
    wherein detecting whether the output signal level is within the window comprises:
        deriving, from the VCO operating condition, a state signal indicating whether the VCO is oscillating and, when oscillating, further indicating the magnitude of the oscillation; and
        comparing the state signal with a first reference signal representing the minimum threshold to produce a first comparison signal indicative of whether the output signal is above the minimum threshold and thus within the window.

6. The method of claim 1, wherein detecting whether the output signal level is within the window comprises:
    deriving-a state signal from the VCO operating condition;
    comparing the state signal with a first reference signal representing the minimum threshold to produce a first comparison signal indicative of whether the output signal is above the minimum threshold;
    comparing the state signal with a second reference signal representing the maximum threshold to produce a second comparison signal indicative of whether the output signal is below the maximum threshold; and
    combining the first and second comparison signals to produce a third comparison signal indicative of whether the output signal is within the window.

7. The method of claim 1, further comprising:
    combining a first reference signal and a second reference signal into a single reference signal with hysteresis; and
    comparing the state signal with the single reference signal to produce a hysteresis-derived comparison signal indicative of whether the output signal is within the window.

8. An amplitude-regulated voltage controlled oscillator (ARVCO) comprising:
    a voltage controlled oscillator (VCO), including a variable-gain cell for providing a gain to produce an output signal level;
    a level detector coupled to the VCO for detecting whether the output signal level is within a window bounded by minimum and maximum thresholds;
    a bias generator coupled to the level detector for generating an automatic gain control (AGC) bias signal;
    a loop-control element coupled to the level detector and coupled to the variable-gain cell for closing an AGC loop of the VCO and controlling the gain with a gain-control signal that tracks the AGC bias signal, when the output signal level is not within the window, wherein the level detector and the loop-control element are arranged to
    open the AGC loop and control the gain with a fixed bias signal derived from the AGC bias signal at the time the AGC loop is opened, when the output signal level is within the window.

9. The ARVCO of claim 8, wherein the level detector and the loop-control element arc further arranged to open the AGC loop when the output signal level is within the window and at a predetermined preferred value.

10. The ARVCO of claim 8, wherein the loop-control element comprises:
    a sample-and-hold element coupled to the AGC bias signal and to a gain-control node of the VCO, and
        wherein the loop-control element is arranged to operate the sample-and-hold element in a TRACK mode to close the AGC loop, and to operate the sample-and-hold element in a HOLD mode to open the loop.

11. The ARVCO of claim 8, wherein the loop-control element is further arranged to
    adjust a response time of the AGC loop in response to a control signal coupled to a sample-and-hold element.

12. The ARVCO of claim 8,
    wherein the maximum threshold is set substantially equal to a maximum output signal level that the VCO can produce in a particular user application, and
    wherein the level detector is arranged to:
        derive, from the VCO operating condition, a state signal indicating whether the VCO is oscillating and, when oscillating, further indicating the magnitude of the oscillation; and
        compare the state signal with a first reference signal representing the minimum threshold to produce a first comparison signal indicative of whether the output signal is above the minimum threshold and thus within the window.

13. The ARVCO of claim 8,
    wherein the level detector is arranged to derive a state signal from the VCO operating condition, and wherein the loop-control element comprises a window-function detector coupled to the level detector and arranged to:
  compare the state signal with a first reference signal representing the minimum threshold to produce a first comparison signal indicative of whether the output signal is above the minimum threshold;
  compare the state signal with a second reference signal representing the maximum threshold to produce a second comparison signal indicative of whether the output signal is below the maximum threshold; and
  combine the first and second comparison signals to produce a third comparison signal indicative of whether the output signal is within the window.

14. The ARVCO of claim 8, wherein the level detector is further arranged to:
  combine a first reference signal and a second reference signal into a single reference signal with hysteresis; and
  compare the state signal with the single reference signal to produce a hysteresis-derived comparison signal indicative of whether the output signal is within the window.

15. An integrated circuit comprising:
  a voltage controlled oscillator (VCO), including a tank circuit for setting an operating frequency of the VCO, and a variable-gain cell coupled to the tank circuit that provides a gain to sustain an oscillation having an output signal level;
  a level detector coupled to the VCO that detects whether the output signal level is within a window bounded by minimum and maximum thresholds;
  a bias generator coupled to the level detector that generates an automatic gain control (AGC) bias signal;
  a loop-control element coupled to the level detector and coupled to the variable-gain cell that closes an AGC loop of the VCO and controls the gain with a gain-control signal that tracks the AGC bias signal, when the output signal level is not within the window, wherein the level detector and the loop-control element are arranged to
  open the AGC loop and control the gain with a fixed bias signal derived from the AGC bias signal at the time the AGC loop is opened, when the output signal level is within the window.

16. The integrated circuit of claim 15, wherein the level detector and the loop-control element are further arranged to open the AGC loop when the output signal level is within the window and at a predetermined preferred value.

17. The integrated circuit of claim 15, wherein the loop-control element comprises:
  a sample-and-hold element coupled to the AGC bias signal and to a gain-control node of the VCO, and
  wherein the loop-control element is arranged to operate the sample-and-hold element in a TRACK mode to close the AGC loop, and to operate the sample-and-hold element in a HOLD mode to open the loop.

18. The integrated circuit of claim 15, wherein the loop-control element is further arranged to
  adjust a response time of the AGC loop in response to a control signal coupled to a sample-and-hold element.

19. The integrated circuit of claim 15,
wherein the maximum threshold is set substantially equal to a maximum output signal level that the VCO can produce in a particular user application, and
wherein the level detector is arranged to:
  derive, from the VCO operating condition, a state signal indicating whether the VCO is oscillating and, when oscillating, further indicating the magnitude of the oscillation; and
  compare the state signal with a first reference signal representing the minimum threshold to produce a first comparison signal indicative of whether the output signal is above the minimum threshold and thus within the window.

20. The integrated circuit of claim 15,
wherein the level detector is arranged to derive a state signal from the VCO operating condition, and
wherein the loop-control element comprises a window-function detector coupled to the level detector and arranged to:
  compare the state signal with a first reference signal representing the minimum threshold to produce a first comparison signal indicative of whether the output signal is above the minimum threshold;
  compare the state signal with a second reference signal representing the maximum threshold to produce a second comparison signal indicative of whether the output signal is below the maximum threshold; and
  combine the first and second comparison signals to produce a third comparison signal indicative of whether the output signal is within the window.

21. The integrated circuit of claim 15, wherein the level detector is further arranged to:
  combine a first reference signal and a second reference signal into a single reference signal with hysteresis; and
  compare the state signal with the single reference signal to produce a hysteresis-derived comparison signal indicative of whether the output signal is within the window.

* * * * *